US011616036B2

(12) United States Patent
Jang et al.

(10) Patent No.: US 11,616,036 B2
(45) Date of Patent: Mar. 28, 2023

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Joohee Jang, Hwaseong-si (KR); Seokho Kim, Hwaseong-si (KR); Hoonjoo Na, Seoul (KR); Jaehyung Park, Anyang-si (KR); Kyuha Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/694,035

(22) Filed: Mar. 14, 2022

(65) Prior Publication Data

US 2022/0208706 A1 Jun. 30, 2022

Related U.S. Application Data

(63) Continuation of application No. 16/831,331, filed on Mar. 26, 2020, now Pat. No. 11,296,045.

(30) Foreign Application Priority Data

Aug. 26, 2019 (KR) .......................... 10-2019-0104505

(51) Int. Cl.
*H01L 27/146* (2006.01)
*H01L 23/00* (2006.01)
(52) U.S. Cl.
CPC .............. *H01L 24/08* (2013.01); *H01L 24/03* (2013.01); *H01L 24/05* (2013.01); *H01L 24/27* (2013.01); *H01L 24/32* (2013.01); *H01L 27/14636* (2013.01); *H01L 2224/03831* (2013.01); *H01L 2224/03845* (2013.01);
(Continued)

(58) Field of Classification Search
CPC combination set(s) only.
See application file for complete search history.

(56) References Cited

U.S. PATENT DOCUMENTS 6,277,731 B1 * 8/2001 Gonzalez .............. H01L 23/485
438/629
9,027,821 B2 5/2015 Di Cioccio et al.
(Continued)

OTHER PUBLICATIONS

Communication dated Dec. 8, 2020, from the European Patent Office in counterpart European Application No. 20180679.1.

*Primary Examiner* — Niki H Nguyen
(74) *Attorney, Agent, or Firm* — Sughrue Mion, PLLC

(57) ABSTRACT

A method includes forming a first substrate including a first dielectric layer and a first metal pad, forming a second substrate including a second dielectric layer and a second metal pad, and bonding the first dielectric layer to the second dielectric layer, and the first metal pad to the second metal pad. One or both of the first and second substrates is formed by forming a first insulating layer, forming an opening in the layer, forming a barrier on an inner surface of the opening, forming a metal pad material on the barrier, polishing the metal pad material to expose a portion of the barrier and to form a gap, expanding the gap, forming a second insulating layer to fill the opening and the gap, and polishing the insulating layers such that a top surface of the metal pad is substantially planar with an upper surface of the polished layer.

20 Claims, 10 Drawing Sheets

(52) U.S. Cl.
CPC .............. *H01L 2224/05018* (2013.01); *H01L 2224/05022* (2013.01); *H01L 2224/05026* (2013.01); *H01L 2224/05073* (2013.01); *H01L 2224/05571* (2013.01); *H01L 2224/08057* (2013.01); *H01L 2224/08145* (2013.01); *H01L 2224/32145* (2013.01)

(56) References Cited

U.S. PATENT DOCUMENTS

| | | |
|---|---|---|
| 9,312,229 B2 | 4/2016 | Chen et al. |
| 9,761,463 B2 | 9/2017 | Tanida et al. |
| 9,941,243 B2 | 4/2018 | Kim et al. |
| 10,262,963 B2 | 4/2019 | Enquist |
| 2002/0146899 A1* | 10/2002 | Chun .................. H01L 23/485 257/E21.507 |
| 2014/0048939 A1* | 2/2014 | Park .................. H01L 21/76883 438/653 |
| 2015/0108648 A1 | 4/2015 | Tsumura et al. |
| 2016/0141282 A1* | 5/2016 | Jang .................. H01L 27/14643 438/455 |
| 2018/0269248 A1* | 9/2018 | Fujii .................. H01L 21/76864 |
| 2019/0096842 A1 | 3/2019 | Fountain, Jr. et al. |
| 2019/0109042 A1 | 4/2019 | Katkar et al. |
| 2019/0148336 A1 | 5/2019 | Chen et al. |
| 2019/0148446 A1 | 5/2019 | Shimotsusa |

* cited by examiner

SEMICONDUCTOR DEVICE AND METHOD OF MANUFACTURING THE SAME

CROSS-REFERENCE TO RELATED APPLICATION

This application is a continuation application of U.S. application Ser. No. 16/831,331 filed Mar. 26, 2020, which claims priority under 35 USC § 119 to Korean Patent Application No. 10-2019-0104505, filed on Aug. 26, 2019, in the Korean Intellectual Property Office (KIPO), the contents of which are incorporated by reference herein in their entirety.

BACKGROUND

1. Field

The present disclosure relates to a semiconductor device and a method of manufacturing the same.

2. Description of the Related Art

Conventionally, a semiconductor device can be reduced in size by bonding a plurality of substrates each of which has semiconductor elements or integrated circuits formed thereon. The bonding surface of each substrate includes an insulating layer and a plurality of metal pads for interconnection formed therein. This bonding surface is subjected to a polishing process for planarization. However, even after polishing the bonding surface of each substrate, a step difference may occur at the metal pad and its adjacent bonding surface, and if the step difference is not controlled to the tolerance range, defects such as voids may occur even after bonding, which can result in a serious yield drop.

SUMMARY

According to an aspect of an embodiment, there is provided a semiconductor device comprising a first semiconductor chip; and a second semiconductor chip disposed on the first semiconductor chip. The first semiconductor chip includes a first substrate; a first insulating layer disposed on the first substrate and having a top surface; a first metal pad embedded in the first insulating layer and having a top surface substantially planar with the top surface of the first insulating layer; and a first barrier disposed between the first insulating layer and the first metal pad. The second semiconductor chip includes a second substrate; a second insulating layer disposed below the second substrate and having a top surface; a second metal pad embedded in the second insulating layer and having a top surface substantially planar with the top surface of the second insulating layer; and a second barrier disposed between the second insulating layer and the second metal pad. The top surfaces of the first insulating layer and the second insulating layer are bonded to provide a bonding interface, the first metal pad and the second metal pad are mutually connected, and a portion of the first insulating layer is in contact with a side region of the first metal pad.

According to another aspect of an embodiment, there is provided a semiconductor device comprising a first substrate; a first insulating layer disposed on the first substrate and having a top surface; a first metal pad embedded in the first insulating layer and having a top surface substantially planar with the top surface of the first insulating layer; a first barrier disposed between the first insulating layer and the first metal pad; and a second insulating layer disposed on the first insulating layer and having a top surface, wherein the first insulating layer and the second insulating layer are bonded to provide a bonded interface, and a portion of the first insulating layer adjacent to the bonded interface contacts a side region of the first metal pad.

According to another aspect of an embodiment, there is provided a semiconductor device comprising a first semiconductor chip; and a second semiconductor chip disposed on the first semiconductor chip. The first semiconductor chip includes a first substrate, a first insulating layer disposed on the first substrate and having a planar top surface, a first metal pad embedded in the first insulating layer and having a top surface substantially planar with the top surface of the first insulating layer, a first barrier disposed between the first insulating layer and the first metal pad. The second semiconductor chip includes a second substrate, a second insulating layer disposed below the second substrate and having a planar top surface, a second metal pad embedded in the second insulating layer and having a top surface substantially planar with the top surface of the second insulating layer, and a second barrier disposed between the second insulating layer and the second metal pad. The top surfaces of the first insulating layer and the second insulating layer are bonded to provide a bonding interface, the first metal pad and the second metal pad are connected, an end portion of the first barrier is spaced apart from the bonding surface, and a portion of the first insulating layer in contact with a side region of the first metal pad includes a material different from the remaining portion of the first insulating layer.

According to another aspect of an embodiment, there is provided a semiconductor device comprising a first semiconductor chip; and a second semiconductor chip disposed on the first semiconductor chip. The first semiconductor chip includes a first substrate; a first insulating layer disposed on the first substrate and having a top surface; a first metal pad embedded in the first insulating layer and having a top surface substantially planar with the top surface of the first insulating layer; and a first barrier disposed between the first insulating layer and the first metal pad. The second semiconductor chip includes a second substrate; a second insulating layer disposed below the second substrate and having a planar surface; a second metal pad embedded in the second insulating layer and having a surface substantially planar with the surface of the second insulating layer; and a second barrier disposed between the second insulating layer and the second metal pad. The surfaces of the first insulating layer and the second insulating layer are bonded to provide a bonding interface, the first metal pad and the second metal pad are connected, an end portion of the first barrier extends to the bonding interface, and a portion of the first insulating layer in contact with a side region of the first metal pad is separated from another portion of the first insulating layer by the first barrier, and includes a material different from another portion of the first insulating layer.

According to another aspect of an embodiment, there is provided a method of manufacturing a semiconductor device, the method comprising forming an opening in an insulating layer disposed on a substrate; forming a barrier on a surface exposed by the opening; forming an metal pad on the barrier to fill an interior of the opening; chemically mechanically polishing the metal pad such that a gap is generated in the opening between an upper end of the metal pad and the barrier; selectively removing the exposed portion of the barrier such that the barrier is removed from the gap, the gap is expanded, and a region of the insulating layer is exposed; forming an additional insulating layer on the metal pad to fill the opening together with the expanded gap; and after the forming the additional insulating layer, polishing the additional insulating layer such that the metal pad has a top surface substantially planar with a surface of the additional insulating layer.

According to another embodiment of the present disclosure, there is provided a method of manufacturing a semiconductor device, the method comprising forming an opening in an insulating layer disposed on a substrate; forming a barrier on a surface exposed by the opening; forming an metal pad on the barrier to fill an interior of the opening; chemically mechanically polishing the metal pad to expose a portion of the barrier; selectively removing the exposed portion of the barrier; forming an additional insulating layer on the metal pad to fill the opening; and polishing the additional insulating layer such that the metal pad has a top surface substantially planar with a surface of the additional insulating layer.

BRIEF DESCRIPTION OF THE DRAWINGS

These and other aspects will be apparent to those of skill in the art by describing in detail exemplary embodiments with reference to the attached drawings in which.

DETAILED DESCRIPTION

Figure 1:
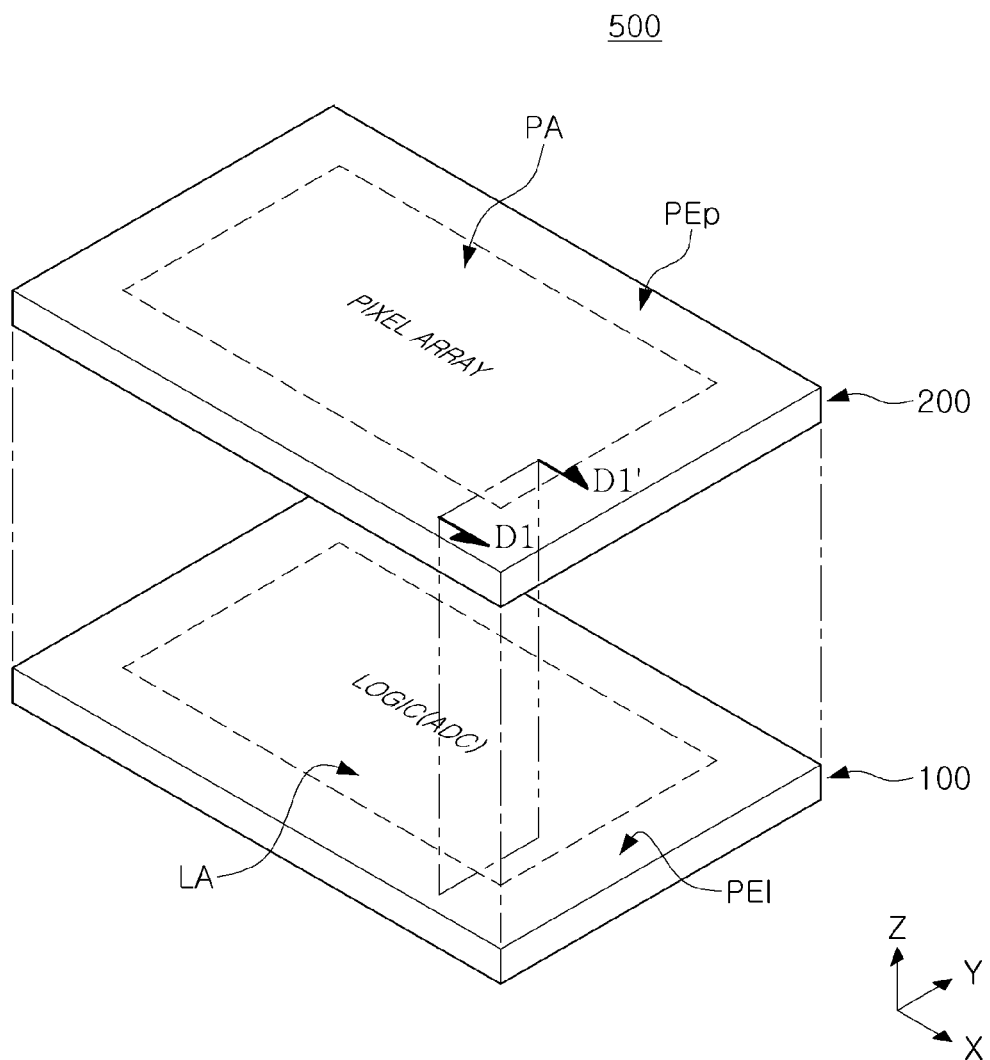
FIG. 1 is a schematic exploded perspective view illustrating a semiconductor device in accordance with an embodiment.

Hereinafter, some embodiments will be described in detail with reference to the accompanying drawings. The same reference numerals are used for the same constituent elements in the drawings, and duplicate description thereof will be omitted.

Figure 2:
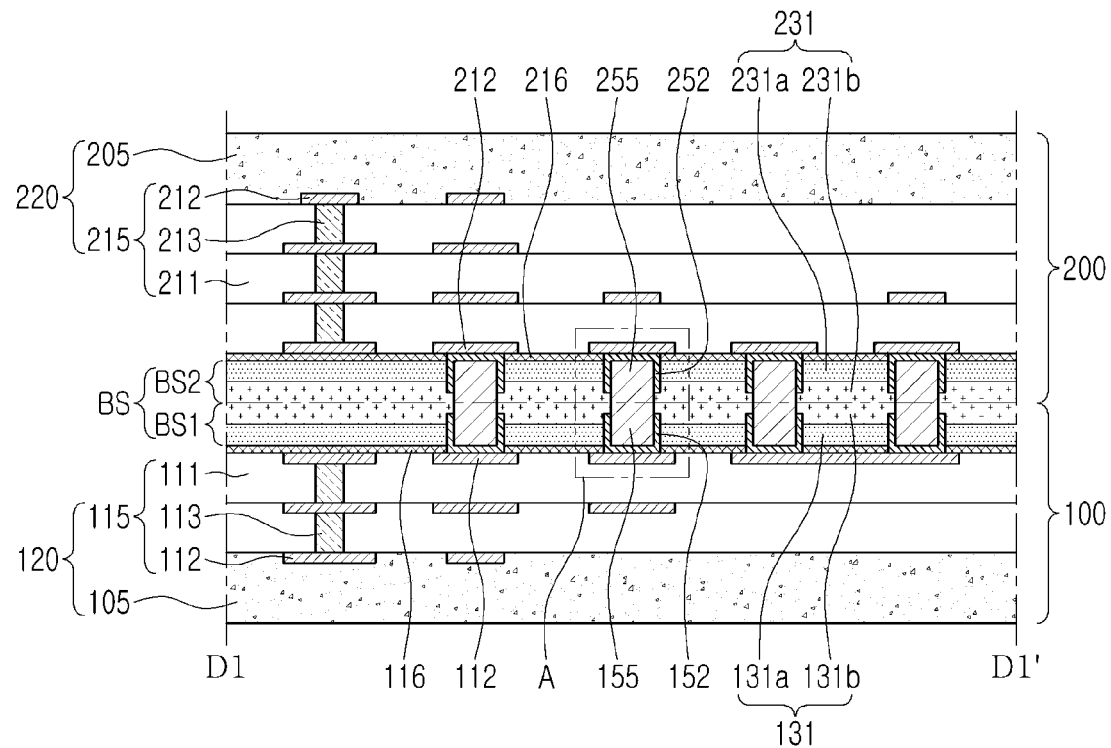
FIG. 2 is a side sectional view showing the semiconductor device shown in FIG. 1.
Figure 3:
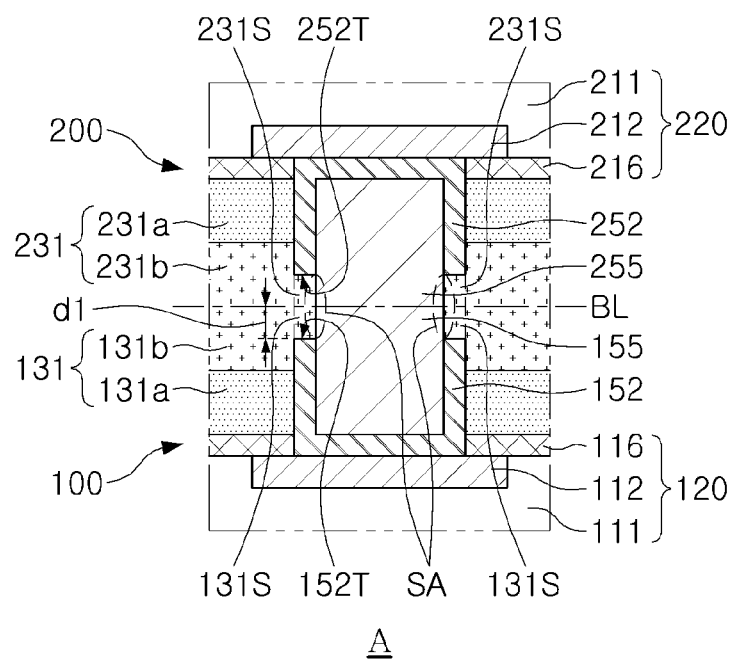
FIG. 3 is an enlarged cross-sectional view illustrating a region "A" of the semiconductor device illustrated in FIG. 2.

FIG. 1 is a schematic exploded perspective view illustrating a semiconductor device in accordance with an embodiment, FIG. 2 is a side sectional view showing the semiconductor device shown in FIG. 1, and FIG. 3 is an enlarged cross-sectional view illustrating a region "A" of the semiconductor device illustrated in FIG. 2.

Referring to FIG. 1, a semiconductor device 500 according to an embodiment includes a first semiconductor chip 100 and a second semiconductor chip 200 stacked on the first semiconductor chip 100.

The semiconductor device 500 may be, for example, a stacked CMOS image sensor (CIS). In this case, the second semiconductor chip 200 may be a sensor chip such as a complementary metal oxide semiconductor (CMOS) image sensor for capturing an object, and the first semiconductor chip 100 may be a logic chip having a logic circuit for reading out the image signal of a captured image from the second semiconductor chip 200 and performing various signal processing on the read image signal.

As illustrated in FIG. 1, the second semiconductor chip 200 may include a pixel area PA and a pixel peripheral area PEp. The pixel area PA may be disposed in the center area of the second semiconductor chip 200, and the plurality of pixels may be configured in a two-dimensional array, and each may include a CMOS device. The pixel peripheral area PEp may be disposed outside the pixel area PA so as to surround the pixel area PA.

The first semiconductor chip 100 may include a logic area LA and a logic peripheral area PEl. The logic region LA may be disposed in the central region of the second semiconductor chip 200, and a plurality of logic elements may be disposed. The plurality of logic elements may configure various circuits for processing pixel signals from pixels of the first semiconductor chip 100. For example, the circuits may include analog signal processing circuits, analog-to-digital converter (ADC) circuits, image signal processing circuits, control circuits, and the like.

In the present disclosure, the logic peripheral area PEl and the pixel peripheral area PEp are disposed on all of the outer portions of the four sides, but embodiments are not limited thereto. At least one of the logic peripheral area PEl and the pixel peripheral area PEp may not include a logic peripheral area PEl on an outer portion of at least one of the four sides.

The first and second semiconductor chips 100 and 200 may be bonded to each other and provide a semiconductor device 500 such as a stacked CMOS image sensor CIS. Referring to the partial cross sections D1-D1', that is, the cross section along the Y direction in the stacked state of the first and second semiconductor chips 100 and 200 shown in FIG. 2, the structure of the semiconductor device 500 is described in more detail.

Referring to FIG. 2, the first semiconductor chip 100 may include a first substrate 120 and a first bonded structure BS1 disposed on an upper surface of the first substrate 120. The second semiconductor chip 200 may include a second substrate 220 and a second bonded structure BS2 disposed on a bottom surface of the second substrate 220.

The first substrate 120 may include a first device substrate 105 having a logic circuit implemented thereon, and a first wiring part 115 disposed on an upper surface of the first device substrate 105. The first wiring part 115 may include first interlayer insulating layers 111, first wiring lines 112, and first vertical contacts 113. The first vertical contacts 113 may electrically connect the first wiring lines 112 or electrically connect the first wiring lines 112 to the first substrate 120 (e.g., a logic circuit).

Similarly, the second substrate 220 may include a second device substrate 205 in which a CMOS circuit is implemented, and a second wiring part 215 disposed on a bottom surface of the second device substrate 205. The second wiring part 215 may include second interlayer insulating layers 211, second wiring lines 212, and second vertical contacts 213. The second vertical contacts 213 may electrically connect the second wiring lines 212 or electrically connect the second wiring lines 212 to the second substrate 220 (e.g., a CMOS circuit).

Although not shown, color filters and micro lenses may be formed on the upper surface of the second device substrate 205. Based on the second device substrate 205 on which the pixels are formed, a structure in which color filters and microlenses are formed in the opposite direction with respect to the second interconnection part 215 is called a back side illumination (BSI) structure. On the contrary, based on the second device substrate 250, the structure in which the color filters and the micro lenses are formed in the same direction as the second wiring part 215, that is, the color filters and the micro lenses are formed on the second wiring part 215, is called a front side illumination (FSI) structure.

The first bonded structure BS1 of the first semiconductor chip 100 may include a first insulating layer 131 disposed on a surface (e.g., an upper surface) of the first substrate 120, a plurality of first metal pads 155 embedded in the first insulating layer 131 and having an end surface exposed by the first insulating layer 131, and a first barrier 152 disposed between the first insulating layer 131 and the first metal pad 155. The first insulating layer 131 may have a planar surface, and the surface of the first insulating layer 131 may have a coplanar surface (hereinafter, also referred to as a "surface") that is substantially planar with the upper section of the first metal pad 155. Each of the first metal pads 155 may be connected to a logic circuit through the first wiring part 115 of the first substrate 120.

Similarly, the second bonded structure BS2 of the second semiconductor chip 200 may include a second insulating layer 231 formed on a surface (e.g., a lower surface) of the second substrate 220, a plurality of second metal pads 255 embedded in a position corresponding to the second metal pad 255 and having an end surface exposed by the second insulating layer 231, and a second barrier 252 disposed between the second insulating layer 231 and the second metal pad 255. The second insulating layer 231 may have a planar surface, and the surface of the second insulating layer 231 may have coplanar surface (hereinafter, also referred to as a "surface") that is substantially planar with the lower section of the second metal pad 255. Each second metal pad 255 may be connected to the CMOS circuit through, for example, the second wiring part 215 of the second substrate 220.

For example, at least one of the first and second metal pads 155, 255 may include Cu, Co, Mo, Ru, W, or an alloy thereof. The first and second barriers 152, 252 may be conductive barriers, and at least one of the first and second barriers 152, 252 may include Ta, TaN, Mn, MnN, WN, Ti, TiN, or a combination thereof.

In the embodiment of FIGS. 1-3, etch stop layers 116, 216 may be included between the first and second insulating layers 131, 231 and the first and second wiring parts 115, 215, respectively. For example, the etch stop layers 116 and 216 may include silicon nitride or aluminum nitride.

For example, the first and second insulating layers 131, 231 may include silicon oxide, silicon nitride, silicon oxynitride, silicon carbonitride, or the like, and may have a multilayer structure having mutually different materials. The first and second insulating layers 131, 231 employed in the embodiment of FIGS. 1-3 may include first insulating films 131a, 231a and second insulating films 131b, 231b, and the first insulating films 131a, 231a may include different materials from the second insulating films 131b, 231b. For example, the first insulating layers 131a, 231a may be silicon oxide, and the second insulating layers 131b, 231b may be silicon oxynitride, silicon carbonitride, or silicon nitride.

As illustrated in FIG. 2, the second semiconductor chip 200 may be disposed on the first semiconductor chip 100 to be bonded with the first semiconductor chip 100. The first and second semiconductor chips 100, 200 may be disposed to be bonded to each other so that the first and second bonded structures BS1 and BS2, that is, the first insulating layer 131 and the first metal pad 155, and the second insulating layer 231 and the second metal pad 255, respectively, face each other.

In the embodiment of FIGS. 1-3, the first semiconductor chip 100 and the second semiconductor chip 200 may be directly boned without adhesives after each surface of the first and the second insulating layers 131,231 is polished and planarized. In this bonding process, the first and second insulating layers 131,231 may be preliminarily bonded by hydrogen bonding due to an intermolecular force, and subsequently, by applying a heat treatment to the first and second insulating layers 131, 231, the first and second semiconductor chips 100, 200 may be bonded due to the bonding between the first metal pad 155 and the second metal pad 255 (e.g., Cu—Cu bonding) together with the covalent bonding between the first and second insulating layers 131, 231. This heat treatment process may be performed at a constant pressure condition. Bonding between the first and second metal pads 155, 255 may also be directly connected without other bonding media (e.g., eutectic metal) to form an mutually interconnected structure.

As described above, the first semiconductor chip 100 and the second semiconductor chip 200 are interconnected by direct bonding of the first and second metal pads 155, 255, and thus the image signals from the second semiconductor chip 200 may be transferred to the logic circuit of the second semiconductor chip 200.

Because bonding of the first and second semiconductor chips 100 and 200 according to the embodiment of FIGS. 1-3 is performed by bonding the first and second metal pads 155, 255 together with the bonding of the first and second insulating layers 131, 231 (i.e., metal bonding), it is also referred to as hybrid bonding. In various embodiments, this bonding may be implemented by the stacking/bonding process of a wafer including a plurality of the first semiconductor chips 100 and a wafer including a plurality of the second semiconductor chips 200 rather than being implemented at individual chip level.

For example, a wafer including a plurality of first semiconductor chips 100 and a wafer including a plurality of second semiconductor chips 200 may be bonded, and then be separated into a plurality of individual stacked chip structures through a sawing process. Each of the stacked chip structures may have a two-layer structure including the first semiconductor chip 100 and the second semiconductor chip 200, like the semiconductor device 500 illustrated in FIG. 1.

In the bonding structure BS employed in the embodiment of FIGS. 1-3, at least one of the first and second insulating layers may have s portion in contact with a side region of the associated metal pad(s) adjacent to the bonding interface (best seen in FIG. 3). At least one insulating layer may be formed in close contact with the side region such that no void is present at an interface with the side region of the associated metal pad (s) adjacent to the bonding interface, thereby ensuring a firm bonding strength.

FIG. 3 is an enlarged cross-sectional view of part "A" of the semiconductor device 500 illustrated in FIG. 2.

Referring to FIGS. 2 and 3, the first insulating layer 131 has a portion 131S contacting a side area SA of the first metal pad 155 adjacent to the bonding interface BL at which the first and second insulating layers 131, 231 are bonded. Similarly, the second insulating layer 231 has a portion 231S in contact with a side area SA of the second metal pad 255 adjacent to the bonding interface BL. As shown in FIG. 3, end portions 152T, 252T of the first and second barriers 152, 252 are spaced apart from the bonding interface BL. The spaced apart distance d1 may depend on a wet etching process conditions for the barrier (see FIG. 4D). For example, the distance d1 may be in a range of about 1 nm to about 100 nm, and in some embodiments, may be in a range of 2 nm to 20 nm. The side areas SA of the first and second metal pads 155, 255 exposed by the gap may be in close contact with the first and second insulating layers 131, 231 as much as the spaced distance d1. As a result, no void exists around the first and second metal pads 155, 255 adjacent to the bonding interface BL, and thus the bonding strength may be enhanced.

In the embodiment of FIGS. 1-3, the first and second insulating layers 131, 231 may include the first insulating films 131a, 231a and the second insulating films 131b, 231b, respectively, as described above. In this case, as shown in FIG. 3, end portions of the first and second barriers 152T, 252T may be located in the second insulating films 131b, 231b. In addition, portions 131S, 231S of the first insulating layers 131 and 231 contacting side areas SA of the first and second metal pads 155, 255 adjacent to the bonding interface BL may be the second insulating films 131b, 231b.

In the embodiment of FIGS. 1-3, the first semiconductor chip 100 and the second semiconductor chip 200 both have the same type of void-free structure, but embodiments are not limited thereto. One of the first and second semiconductor chips 100 and 200 may take the void-free structure described above, and the other semiconductor chip may have another type of void-free structure or a related art structure. Such various embodiments will be described later with reference to FIGS. 6A to 6C.

In the embodiment of FIGS. 1-3, the first semiconductor chip 100 is illustrated as including only a logic region. In some embodiments, the first semiconductor chip 100 may further include a memory region in addition to the logic region. Memory elements may be disposed in the memory area. For example, the memory devices may include Dynamic Random Access Memory (DRAM) and/or Magnetic Random Access Memory (MRAM).

The semiconductor device 500 according to the embodiment of FIGS. 1-3 is illustrated as a two-layered structure of the first and second semiconductor chips 100, 200, but in another embodiment, the semiconductor device may have a structure in which three or more semiconductor chips are stacked.

For example, a stacked CIS according to some embodiments may include a first semiconductor chip in which logic elements are disposed and a second semiconductor chip disposed on top of the first semiconductor chip and having a pixel and a CMOS sensor, and a third semiconductor chip disposed under the first semiconductor chip. The third semiconductor chip may include a memory device. Even in this case, at least one of the two bonding structures between the first to third semiconductor chips may have the bonding structure according to the embodiment of FIGS. 1-3.

FIGS. 4A through 4F are cross-sectional views for describing a method of manufacturing the semiconductor device illustrated in FIG. 3, in accordance with an embodiment. The manufacturing process may be a process of forming the first bonding structure BS1 of the first semiconductor chip 100 of the semiconductor device 500 illustrated in FIGS. 1 and 2, and the manufacturing process may be performed at a wafer level of the first substrate 120.

Figure 4A:
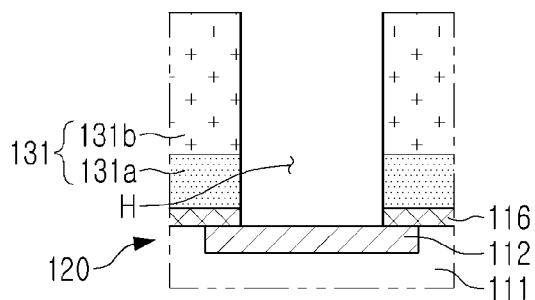
FIGS. 4A through 4F are cross-sectional views for describing a method of manufacturing the semiconductor device illustrated in FIG. 3, in accordance with an embodiment.

Referring to FIG. 4A, an opening H is formed in the first insulating layer 131 disposed on the first substrate 120.

The first insulating layer 131 is formed to cover the first wiring line 112 exposed from a surface of the first substrate 120. The first insulating layer 131 may include a first insulating film 131a disposed on the first substrate 120 and a second insulating film 131b disposed on the first insulating layer 131a. For example, the first insulating film 131a may be silicon oxide, and the second insulating film 131b may be silicon oxynitride, silicon carbonitride, or silicon nitride.

The opening H may be formed to expose a portion of the first wiring line 112. As described above, the first wiring line 112 may be connected to a logic element of the first substrate 120. The opening H may be formed in the form of a hole or a trench. When the etch stop layer 116 is provided on the first wiring line 112, the etch stop layer 116 may be removed to expose the first wiring line 112.

Figure 4B:
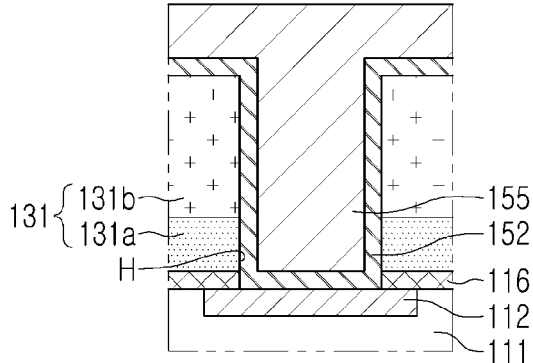

Referring to FIG. 4B, a first barrier 152 and a first metal pad 155 are sequentially formed in the opening H.

The first barrier 152 is conformally formed on the inner surfaces of the opening H and the top surface of the first insulating layer 131. For example, the first barrier 152 may include Ta, TaN, Mn, MnN, WN, Ti, TiN, or a combination thereof. A first metal pad is formed on the first barrier to fill the inside of the opening H. For example, the first metal pad 155 may include Cu, Co, Mo, Ru, W, or an alloy thereof. In some embodiments, the first barrier 152 may be TaN, and the first metal pad 155 may be Cu.

Figure 4C:
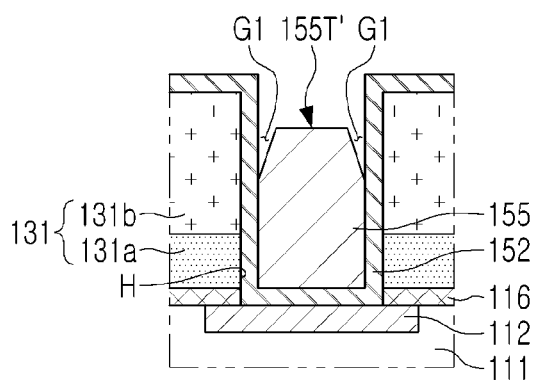

Next, referring to FIG. 4C, the first metal pad 155 is polished using a chemical mechanical polishing (CMP) process.

In this process, a portion of the first metal pad 155 positioned on the first insulating layer 131 is removed using the CMP process. In this CMP process, the upper end of the first metal pad 155 may have a planar surface with an upper surface of the first insulating layer 131, but in fact, a step difference may occur with the first insulating layer 131.

Meanwhile, galvanic corrosion may occur between the material of the first insulating layer 131 and the metal of the first metal pad 155. And as a result, as shown in FIG. 4C, the first metal pad 155 may have a corner portion thereof removed. The edge portion of the upper end 155T' of the first metal pad 155 may be removed after the CMP process. Accordingly, a first gap G1 may be formed between a portion of the first insulating layer 131a adjacent to the upper end 155T' of the first metal pad 155 and the upper end 155T'. This gap G1 remains around the metal pad and causes voids after the bonding process.

Figure 4D:
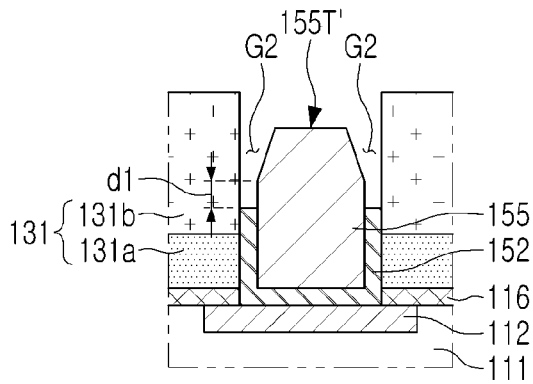

Referring to FIG. 4D, the exposed portion of the first barrier 152 may be selectively removed.

The process may be performed by wet etching, which may selectively etch the first barrier 152. For example, when the first barrier 152 is TaN, a wet etching process to selectively remove the material of the first barrier 152 may be performed so that the first insulating layer 131 and the first metal pad 155 which is formed of other metals are not damaged.

A portion of the first barrier 152 disposed on the upper surface of the first insulating layer 131 and a portion of the first barrier 152 exposed in the inside of the opening H may also be removed. Since the first barrier 152 is removed by a wet etching process, the first barrier 152 may additionally be removed in a portion which is not exposed by the first gap G1, that is, in the portion between the first insulating layer 131 and the first metal pad 155 to a depth equal to the distance d1. The depth (and thus the distance) may be predetermined. Although embodiments are not limited thereto, the additionally removed depth (and thus the distance d1) may, for example, be equal to or less than 100 nm.

As a result, the first gap G1 between the upper end 155T' of the first metal pad 155 and the first insulating layer 131 may be provided as an expanded second gap G2. For example, as compared with the first gap G1 of FIG. 4C, the expanded second gap G2 may increase by the thickness of the removed first barrier 152 in terms of width and may increase by the depth of the additionally removed portion of the first barrier 152 in terms of height.

Figure 4E:
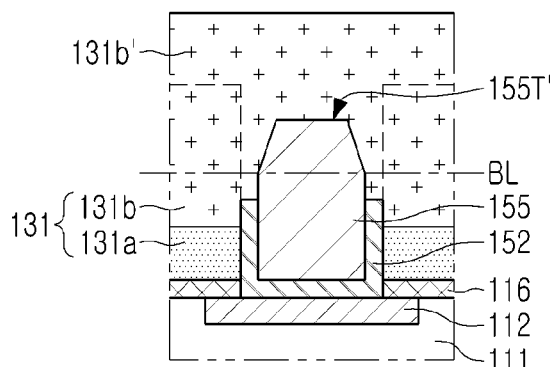

Next, referring to FIG. 4E, an additional insulating layer 131b' may be formed on the metal pad 155 so that the opening H is filled.

The expanded gap G2 may also be filled while the opening H is filled by the additional insulating layer 131b'. In particular, since the second gap G2 extends to a sufficient size (e.g., several tens of nm or more) in the foregoing process, the expanded second gap G2 may be filled by a general insulating layer forming process (e.g., CVD deposition, etc.). The additional insulating layer 131b' may be in contact with the top surface 155T of the first metal pad 155 and an adjacent side region thereof, i.e., a portion without the first barrier 152.

For example, the additional insulating layer 131b' may include silicon oxide, silicon nitride, silicon oxynitride, silicon carbonitride, and the like. In the embodiment of FIGS. 4A-4F, the additional insulating layer 131b' may be the same material as the second insulating film 131b. The additional insulating layer 131b' is not limited thereto, and may be formed of a material different from that of other surrounding insulating layers (e.g., the second insulating layer 131b). (See FIGS. 6A and 6B)

Figure 4F:
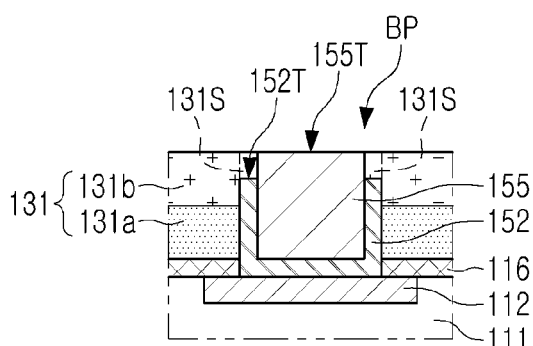

Next, referring to FIG. 4F, the result obtained in the foregoing process is polished to form the bonding surface BP on which the top surface 155T of the first metal pad 155 is exposed.

In the process of FIGS. 4A-4F, at the bonding surface BP, the first metal pad 155 may have an upper surface 155T that is substantially planar with the surface of the first insulating layer 131. An end 152T of the first barrier 152 may be spaced apart from the bonding surface BP. After the polishing process, the additional insulating layer 131b' may remain as a portion 131S having a surface that is substantially planar with the surface of the first insulating layer 131. The remaining portion 131S may be understood as a part of the first insulating layer 131, and may be directly provided without a first barrier 152 to an side region of the first metal pad 155 adjacent to the bonding surface BP.

In some embodiments, a similar manufacturing process may be performed to form the second bonding structure BS2 of the second semiconductor chip 200 of the semiconductor device 500 illustrated in FIGS. 1 and 2.

Figure 5A:
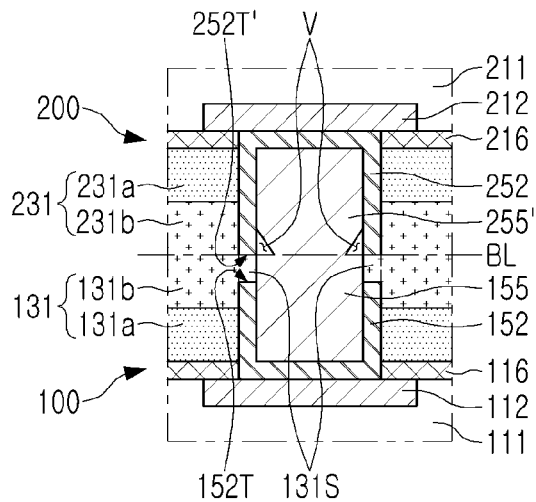
FIGS. 5A through 5C are cross-sectional views illustrating semiconductor devices in accordance with various embodiments.
Figure 5B:
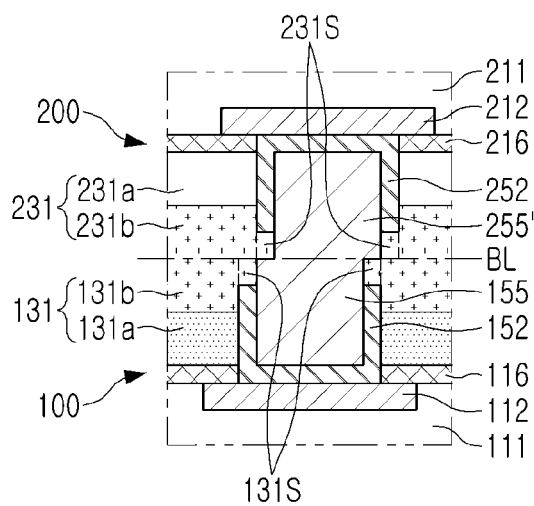
Figure 5C:
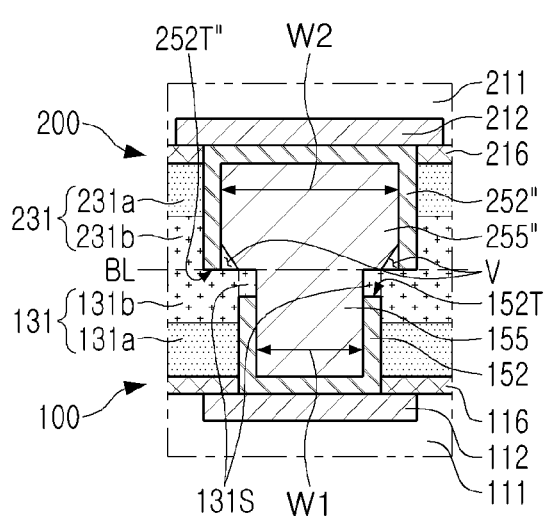

FIGS. 5A through 5C are cross-sectional views illustrating semiconductor devices in accordance with various embodiments.

Referring to FIG. 5A, a semiconductor device may be understood with reference to the embodiment shown in FIG. 1 through FIG. 3, except that a void V is present in a bonded structure of a semiconductor chip (e.g., the second semiconductor chip 200). In addition, elements of the embodiment of FIG. 5A may be understood with reference to the description of the same or similar elements of the embodiment shown in FIGS. 1 to 3 unless specifically stated otherwise.

The first semiconductor chip 100 employed in embodiment of FIG. 5A may have a void-free structure as described in the embodiment of FIGS. 1-3. Specifically, the end portion 152T of the first barrier 152 is spaced apart from the bonding interface, and in the spaced area, the first insulating layer 131 has a portion 131S in contact with the side region of the first metal pad 155 and adjacent to the bonding interface.

On the other hand, the second semiconductor chip 200 employed in embodiment of FIG. 5A has a void V around the second metal pad which is similar to the related art. In detail, an end portion 252T of the second barrier 252 extends to the bonding interface and the void V is generated between the second barrier 252 and a side region of the first metal pad 155 at a region adjacent to the bonding interface.

Also in the embodiment of FIG. 5A, even if voids V exist at the bonding surface of the second semiconductor chip 200, the voids V are removed from the bonding surface of the first semiconductor chip 100 on the other side, thereby improving the overall bonding strength.

Referring to FIG. 5B, a semiconductor device may be understood with reference to the embodiment illustrated in FIGS. 1 to 3, except that the first and second metal pads are slightly misaligned. In addition, elements of the embodiment of FIG. 5B may be understood with reference to the description of the same or similar elements of the embodiment shown in FIGS. 1 to 3 unless specifically stated otherwise.

In some situations, the first and second metal pads 155 and 255 may be exactly aligned prior to form a bonding structure but, during bonding, the first and second metal pads 155 and 255 may be bonded to be slightly staggered within a tolerance range. Even in this slightly staggered state, both the first and second semiconductor chips 100 and 200 have a void free structure, thereby ensuring a firm bonding, and effectively preventing defect issues due to expansion of the void during a thermal compression for metal bonding of the first and the second metal pads (155, 255).

Referring to FIG. 5C, a semiconductor device may be understood with respect to the embodiment illustrated in FIGS. 1 to 3 except that the first and second metal pads to be bonded may be different. In addition, elements of the embodiment of FIG. 5C may be understood with reference to the description of the same or similar elements of the embodiments shown in FIGS. 1 to 3 unless specifically stated otherwise.

In some embodiments, the first and second metal pads 155 and 255 to be bonded may not necessarily have the same size. As in the embodiment of FIG. 5C, the second metal pad 255 may have a width W2 greater than the width W1 of the first metal pad 155. Similarly to FIG. 5A, the first semiconductor chip 100 may have a void-free structure as in the embodiment of FIGS. 1-3, while in the second semiconductor chip, an end portion 252T of the second barrier 252 may extend to the bonding interface, and voids V may be generated between the second barrier 252 and a side region of the first metal pad 155 at the region adjacent to the bonding interface BL.

Also in the embodiment of FIG. 5C, even if voids V exist at the bonding surface of the second semiconductor chip 200, the voids V may be removed from the bonding surface of the first semiconductor chip 100 on the other side, thereby improving the overall bonding strength.

In the fabrication process according to the embodiment of FIGS. 4A-4F, an additional insulation layer filling the expanded gap may be used with a material different from the first insulation layer. This will be described with reference to the processes of FIGS. 6A and 6B.

Figure 6A:
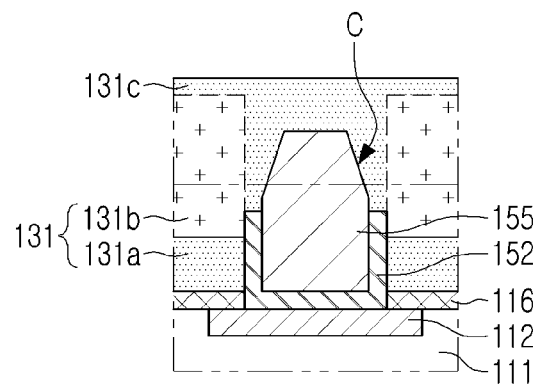
FIGS. 6A and 6B are cross-sectional views for describing a method of manufacturing a semiconductor device, in accordance with an embodiment.
Figure 6B:
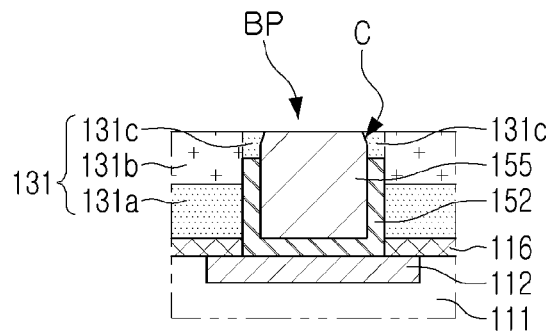

FIGS. 6A and 6B are cross-sectional views for describing a method of manufacturing a semiconductor device according to an embodiment, and may be understood as processes introduced after the process of FIG. 4D. That is, processes of FIG. 4A-4D may be performed before the processes illustrated in FIGS. 6A and 6B.

Referring to FIG. 6A, an additional insulating layer 131c may be formed on the metal pad 155 to fill the opening H with the extended gap G2.

The additional insulating layer 131c may be formed of an insulating material different from the second insulating film 131b. For example, when the first insulating film 131a is silicon oxide and the second insulating film 131b is silicon carbonitride, the additional insulating film 131c may be silicon oxide. Of course, this is only an example, and in some embodiments, the additional insulating film 131c may be formed of a material different from both the first insulating film 131a and the second insulating film 131b. For example, the additional insulating film 131c may be formed of silicon oxynitride, silicon nitride, or the like. The additional insulating film 131c may contact the top surface 155T and the adjacent side region of the first metal pad 155 without the first barrier 152, and may also be separated from the second insulating film 131b.

Next, referring to FIG. 6B, the result obtained in the foregoing process (i.e., in FIG. 6A) may be polished to form the bonding surface BP on which the top surface 155T of the first metal pad 155 is exposed.

After polishing, at the bonding surface BP, the metal pad 155 may have a top surface 155T that is substantially planar with the surface of the first insulating layer 131. An end portion 152T of the first barrier 152 may be spaced apart from the bonding surface BP. In the spaced region, a side region of the first metal pad 155 adjacent to the bonding surface BP may be in contact with the remaining portion 131S of the additional insulating film. The portion 131S may include a material different from that of the first insulating layer 131.

In addition, the shape of the upper end of the first metal pad 155 may be different from that of the embodiments of FIGS. 1-4F, depending on the polished thickness in this process. In the embodiment of FIGS. 1-4F, the polishing is performed sufficiently so that the upper end of the final first metal pad 155 has a substantially vertical side surface (see FIG. 4F). By contrast, in FIG. 6B, a region C from which the upper edge portion 155 is removed may remain in the final structure.

Figure 7:
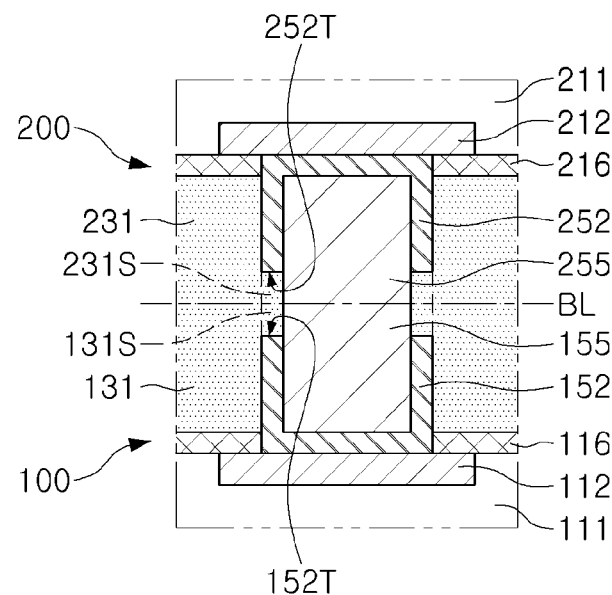
FIG. 7 is a cross-sectional view illustrating a semiconductor device in accordance with an embodiment.

FIG. 7 is a cross-sectional view illustrating a semiconductor device according to an embodiment.

Referring to FIG. 7, a semiconductor device may be understood with reference to the embodiment illustrated in FIGS. 1 to 3 except that the first insulating layer 131 may be formed of a single insulating material. In addition, elements of the embodiment of FIG. 7 may be understood with reference to the description of the same or similar elements of the embodiments shown in FIGS. 1 to 3 unless specifically stated otherwise.

Similar to the embodiment of FIGS. 1-3, the first bonding structure of the first semiconductor chip 100 may include a first insulating layer 131 disposed on a surface of the first substrate 120, a plurality of first metal pads embedded in the first insulating layer 131 and exposed from the first insulating layer 131, and a first barrier 152 disposed between the first insulating layer 131 and the first metal pad 155. The first insulating layer 131 may have a planar surface, and the surface of the first insulating layer 131 may have a surface substantially coplanar with the top surface 155T of the first metal pad 155. Each of the first metal pads 155 may be connected to a logic circuit through the first wiring part 115 of the first substrate 120.

Similarly, the second bonding structure of the second semiconductor chip 200 may include a second insulating layer 231 formed on a surface (e.g., a bottom surface) of the second substrate 220, a plurality of second metal pads 255 embedded in a position corresponding to the second metal pad 255 and having an exposed section from the second insulating layer 231, and the second barrier 252 disposed between the second insulating layer 231 and the second metal pad 255. The second insulating layer 231 may have may have a coplanar surface substantially planar with an upper surface of the second metal pad 255. Each second metal pad 255 may be connected to the CMOS circuit through, for example, the second wiring part 215 of the second substrate 220.

Unlike the embodiment of FIGS. 1-3, the first and second insulating layers 131 and 231 may be formed of a single material. For example, the first and second insulating layers 131 and 231 may include silicon oxide, silicon nitride, silicon oxynitride, silicon carbonitride, and the like.

The first insulating layer 131 may have a portion 131S in contact with a side region of the first metal pad 155 adjacent to the bonding interface BL. Similarly, the second insulating layer 231 may have a portion 231S in contact with a side region of the second metal pad 255 adjacent to the bonding interface BL. As a result, no voids exist around the first and second metal pads 155 and 255 adjacent to the bonding interface BL, and thus the bonding strength may be enhanced.

FIGS. 8A to 8E are cross-sectional views for describing a method of manufacturing a semiconductor device illustrated in FIG. 7, in accordance with an embodiment.

Figure 8A:
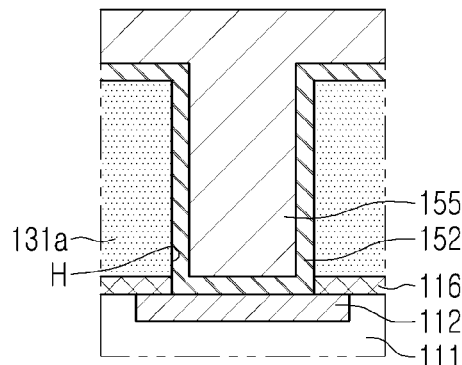
FIGS. 8A through 8E are cross-sectional views for describing a method of manufacturing the semiconductor device illustrated in FIG. 7, in accordance with an embodiment.

Referring to FIG. 8A, the first barrier 152 and the first metal pad 155 are sequentially formed in the opening H in the first insulating layer 131.

The first insulating layer 131 may include, for example, silicon oxide as a single material. The opening H may be formed to expose a portion of the first wiring line 112. As described above, the first wiring line 112 may be connected to a logic element of the substrate 120. The first barrier 152 is conformally formed on the inner surfaces exposed by the opening H and the upper surface of the first insulating layer 131. The first metal pad 155 is formed on the first barrier 152. In some embodiments, the first barrier 152 may be TaN, and the first metal pad 155 may be Cu.

Figure 8B:
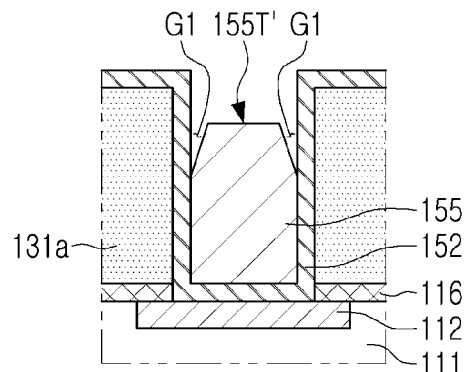

Next, referring to FIG. 8B, the first metal pad 155 may be polished using a CMP process.

In this process, a portion of the first metal pad 155 positioned on the first insulating layer 131 is removed using the CMP process. In such a CMP process, a step difference may be generated from the first insulating layer 131, and a corner portion of the upper portion 155T' of the first metal pad 155 may be removed due to galvanic corrosion. As a result, the first gap G1 may be formed as to the first insulating layer around the upper portion 155T' of the first metal pad 155. The first gap G1 may remain around the first metal pad 155 to cause voids after the bonding process.

Figure 8C:
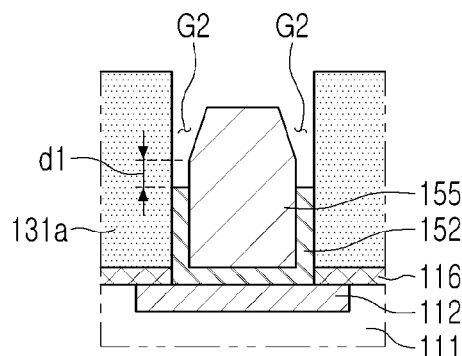

Subsequently, referring to FIG. 8C, the exposed portion of the first barrier 152 may be selectively removed.

The process may be performed by wet etching, which may selectively etch the first barrier 152. A portion of the first barrier 152 disposed on the upper surface of the first insulating layer 131 and a portion exposed in the inside of the opening H may also be removed. Since the first barrier 152 is removed by a wet etching process, the first barrier 152 may be additionally removed in a portion that is not exposed in the gap G1, that is, in portion between the first insulating layer 131 and the first metal pad 155 to a depth equal to the distance d1. The depth (and thus the distance) may be predetermined. As a result, the first gap G1 between the upper portion 155T' of the first metal pad 155 and the first insulating layer 131 may be provided as an expanded second gap G2.

Figure 8D:
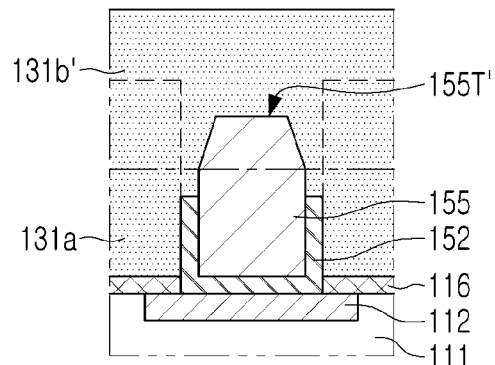

Next, referring to FIG. 8D, an additional insulating layer 131b' may be formed on the first metal pad 155 so that the opening H is filled.

The expanded second gap G2 may also be filled together while the opening H is filled by the additional insulating layer 131b'. In particular, since the second gap G2 extends to a sufficient size (e.g., several tens of nm or more) in the foregoing process, the expanded second gap G2 may be filled by a general insulation layer forming process (e.g., CVD deposition, etc.). The additional insulating layer 131b' may contact the top surface 155T and the adjacent side region of the first metal pad 155 without the first barrier 152.

Figure 8E:
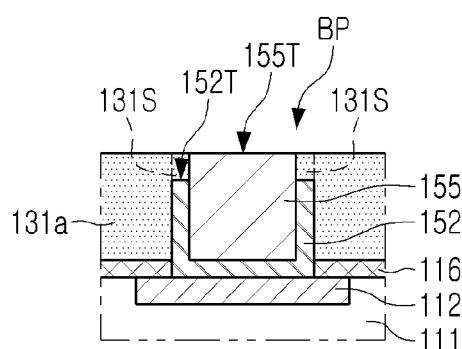

Next, referring to FIG. 8E, the result obtained in the foregoing process is polished to form the bonding surface BP at which the top surface 155T of the metal pad 155 is exposed.

In the process of FIGS. 8A-8E, at the bonding surface BP, the metal pad 155 may have a top surface 155T that is substantially planar with the surface of the first insulating layer 131. An end portion 152T of the first barrier 152 may be spaced apart from the bonding surface BP. After the polishing process, the additional insulating layer 131b' may remain as a portion 131S having a surface that is substantially planar with the surface of the first insulating layer 131. The side surface of the first metal pad 155 adjacent to the bonding surface BP may be directly contacted without the first barrier 152.

Figure 9A:
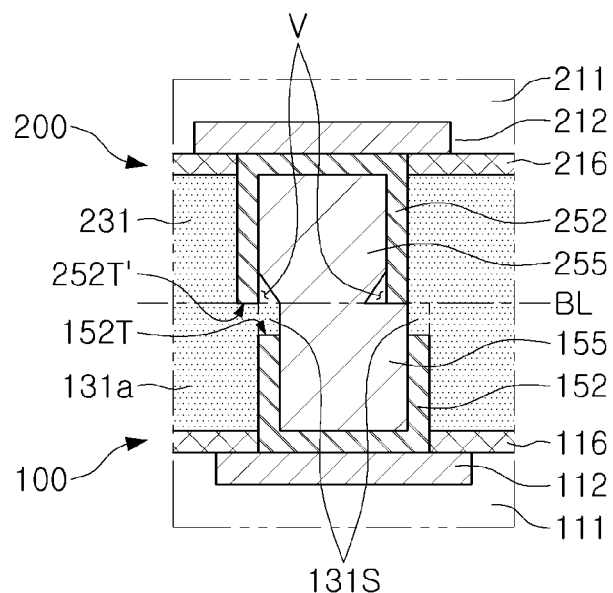
FIGS. 9A and 9B are cross-sectional views illustrating semiconductor devices in accordance with various embodiments.
Figure 9B:
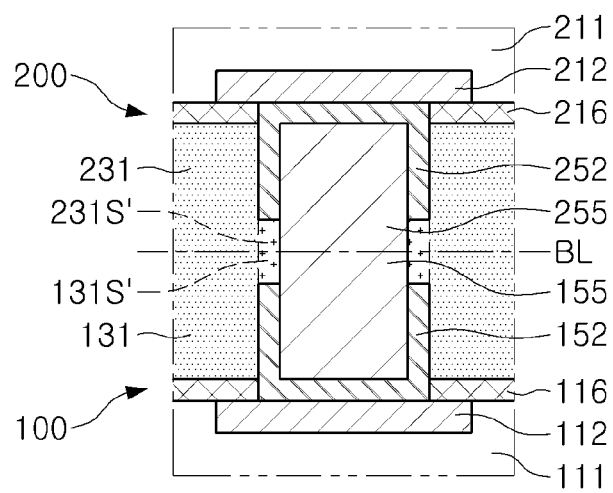

FIGS. 9A and 9B are cross-sectional views illustrating semiconductor devices in accordance with various embodiments.

Referring to FIG. 9A, a semiconductor device may be similar to the embodiment shown in FIG. 7, except for the misalignment with the first semiconductor chip 100 while the void V is present in the bonding structure of the second semiconductor chip 200. In addition, the elements of the embodiment of FIG. 9A may be understood with reference to the description of the same or similar elements of the embodiment shown in FIG. 7 unless specifically stated otherwise.

The first semiconductor chip 100 employed in embodiment of FIG. 9A has a void-free structure as described in the embodiment of FIG. 7. In detail, the end portion 152T of the first barrier 152 is spaced apart from the bonding interface, and in the spaced area, the first insulating layer 131 has a portion 131S in contact with a side region of the first metal pad adjacent to the bonding interface BL.

On the other hand, the second semiconductor chip 200 has a void V around the second metal pad 255. Specifically, the end portion 252T' of the second barrier 252 extends to the bonding interface BL, and the void V is generated between the second barrier 252 and a side region of the first metal pad 155 at the region adjacent to the bonding interface BL. In addition, in the embodiment of FIG. 9, the first and second metal pads 155 and 255 may be bonded to be slightly staggered in the tolerance range.

Also in the embodiment of FIG. 9, even if the voids V are present on the bonding surface of the second semiconductor chip 200 and slightly misaligned, the voids V are removed from the bonding surface of the first semiconductor chip 100 on the other side, thereby improving the overall bonding strength.

Referring to FIG. 9B, a semiconductor device may be similar to the embodiment shown in FIG. 7, except that insulating layer portions 131S' and 231S' in contact with side areas of the first and second metal pads 155 and 255 are formed of a material different from the first and the second insulating layers 131 and 231. In addition, the elements of the embodiment of FIG. 9B may be understood with reference to the description of the same or similar elements of the embodiment shown in FIG. 7 unless specifically stated otherwise.

Both the first and second semiconductor chips 100 and 200 may have a void-free structure. Specifically, end portions 152T and 252T of the first and second barriers 152 and 252 are spaced apart from the bonding interface, respectively, and at the spaced region, the first and second insulating layers 131 and 231 have portions 131S' and 231S' contacting side surfaces of the first and second metal pads 155, adjacent to the bonding interface, respectively. The contact portions 131S' and 231S' may include a material different from those of the first and second insulating layers 131 and 231, respectively. According to this structure, the semiconductor device illustrated in FIG. 9B may be manufactured by using an additional insulating layer 131b' shown in FIG. 8D as a material different from that of the first insulating layer 131.

Unlike the foregoing embodiments, the barrier may be formed by filling the gap generated in the CMP process with the insulating material without wet etching the barrier. This embodiment is shown in FIG. 10.

Figure 10:
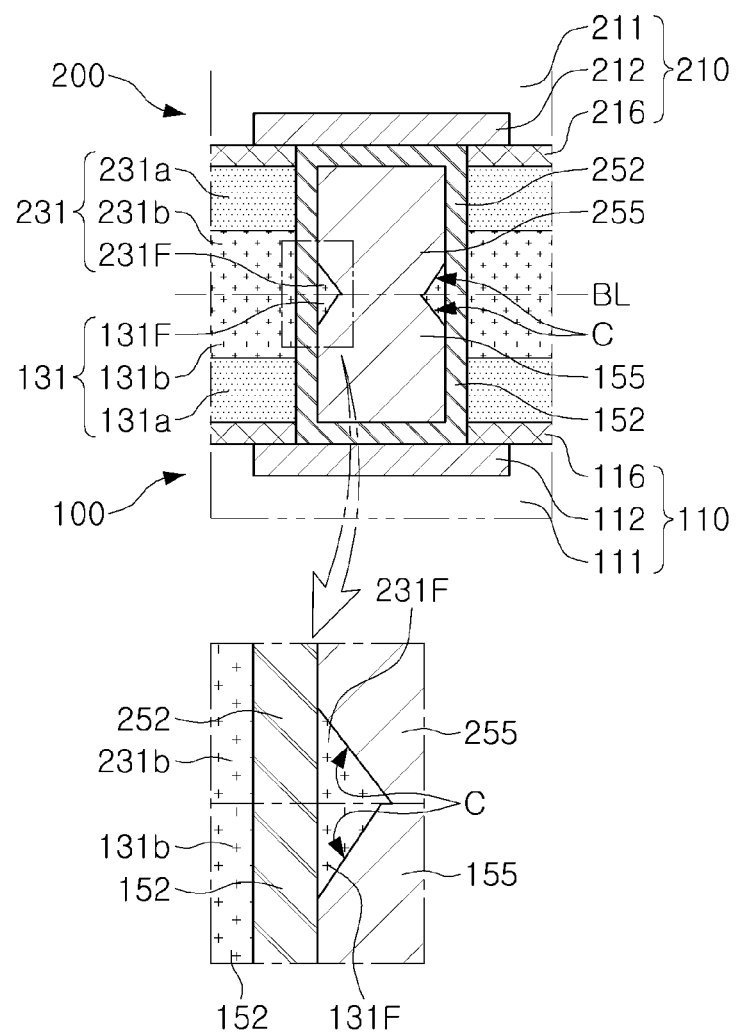
FIG. 10 is a cross-sectional view illustrating a semiconductor device in accordance with an embodiment.

FIG. 10 is a cross-sectional view illustrating a semiconductor device according to an embodiment.

Referring to FIG. 10, bonded first and second semiconductor chips 100 and 200 are shown. The first semiconductor chip 100 includes a first substrate, a first insulating layer 131 disposed on the first substrate 120 and having a planar surface, and a first metal pad 155 embedded in the first insulating layer 131 and having a cross section substantially planar with the surface of the first insulating layer 131, and a first barrier 152 disposed between the first insulating layer 131 and the first metal pad 155.

Similarly, the second semiconductor chip 200 may include a second substrate 220, a second insulating layer 231 disposed on the second substrate 220 and having a planar surface, a second metal pad 255 buried in the second insulating layer 231 and having a cross section substantially planar with the surface of the second insulating layer 231, and a second barrier 252 disposed between the second insulating layer 231 and the second metal pad 255.

The first and second insulating layers 131 and 231 employed in the embodiment of FIG. 10 may include first insulating films 131a and 231a and second insulating films 131b and 231b, and the first insulating films 131a and 231a may include different materials from the second insulating films 131b and 231b. For example, the first insulating films 131a and 231a may be silicon oxide, and the second insulating films 131b and 231b may be silicon oxynitride, silicon carbonitride, or silicon nitride.

Surfaces of the first insulating layer 131 and the second insulating layer 231 may be bonded to each other to provide a bonding interface BL. The first metal pad 155 and the second metal pad 255 may be connected to each other.

An end portion of the first barrier 155 extends to the bonding interface BL, and a portion 131F of the first insulating layer 131 that contacts a side region of the first metal pad 155 may be separated by the other portions 131a and 131b of the first insulating layer 131 and by the first barrier 152. Similarly, an end portion of the second barrier 255 extends to the bonding interface BL, and the portion 231F of the second insulating layer 231 in contact with a side region of the second metal pad 255 may be separated by the other portions 231a and 231b of the second insulating layer 231 and by the second barrier 252.

In other words, as shown in FIG. 10, side regions of the first and second metal pads 155 and 255 adjacent to the bonding interface BL have a concave portion C, and the concave portion C may be charged by insulating portions 131F and 231F.

As a result, no void may exist around the first and second metal pads 155 and 255 adjacent to the bonding interface BL, thereby enhancing the bonding strength.

In the embodiment of FIG. 10, both the first semiconductor chip 100 and the second semiconductor chip 200 have the same void-free structure, but embodiments are not limited thereto, and in some embodiments, only one semiconductor chip of the first and second semiconductor chips may have the void free structure, and the other semiconductor chip may have another type of void-free structure or the same structure as the related art. Such various embodiments will be described later with reference to FIGS. 12A to 12C.

Figure 11A:
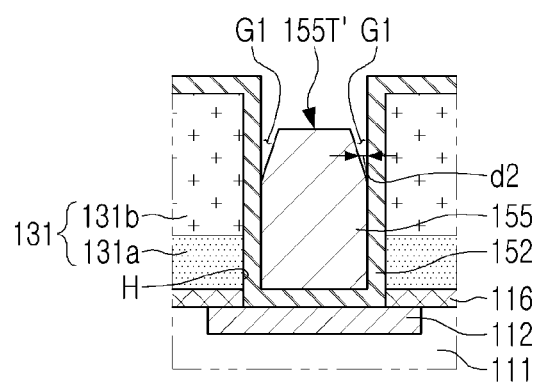
FIGS. 11A through 11C are cross-sectional views for describing a method of manufacturing the semiconductor device illustrated in FIG. 10, in accordance with an embodiment.
Figure 11B:
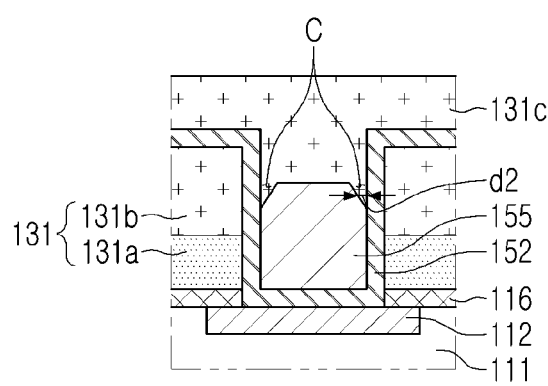
Figure 11C:
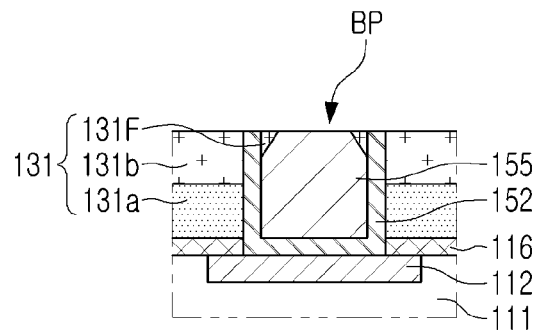

FIGS. 11A to 11C are cross-sectional views for describing a method of manufacturing the semiconductor device illustrated in FIG. 10, in accordance with an embodiment.

Referring to FIG. 11A, the first metal pad 155 is polished using a CMP process as a process corresponding to FIG. 4C of the manufacturing method according to the above-described embodiment. That is, processes of FIGS. 4A and 4B may be performed prior to that of FIG. 11A.

In the process of FIG. 11A, a portion of the first metal pad 155 positioned on the first insulating layer 131 may be removed using the CMP process. In this CMP process, a step difference may be present between an upper end of the first metal pad 155 and the first insulating layer 131, and a corner of the upper end 155T' of the first metal pad 155 may be removed due to galvanic corrosion after the CMP process. As a result, a gap G1 may be generated between the upper end 155' and the first insulating layer around the upper end 155T' of the first metal pad 155.

Next, referring to FIG. 11B, an additional insulating layer 131b' may be formed on the metal pad 155 so that the opening H is filled.

The gap G1 may also be filled while the opening H is filled by the additional insulating layer 131c. Unlike the previous embodiment (FIG. 4E), since the barrier 152 remains without additional etching, the gap G1 may have a very narrow interval d2. For example, the interval d2 of the gap G1 may be 2 nm or less (in some embodiments, 1 nm or less). Therefore, in order to fill the gap G1, the forming process of the additional insulating layer 131c may include atomic layer deposition (ALD). In some embodiments, the first and second insulating films are formed by a deposition process such as a CVD process, while the additional insulating layer 131c is formed by an ALD process, so that the additional insulating layer 131c may have a different film quality from the first and second insulating layers 131a and 131b.

Referring to FIG. 11C, the result obtained after the foregoing process of FIG. 11B may be polished to form the bonding surface BP on which the top surface 155T of the metal pad 155 is exposed.

At the bonding surface BP, the metal pad 155 may have a top surface 155T that is substantially planar with the surface of the first insulating layer 131. An end portion 152T of the first barrier 152 may be spaced apart from the bonding surface BP. After the polishing process, the additional insulating layer may remain as a portion 131F having a surface that is substantially planar with the surface of the first insulating layer 131. The remaining portion 131F may be understood as a portion of the first insulating layer 131, and the remaining portion 131F in direct contact with a side region of the first metal pad 155 and adjacent to the bonding surface BP may be separated from other portions of the first insulating layer 131 by the first barrier 152.

Figure 12A:
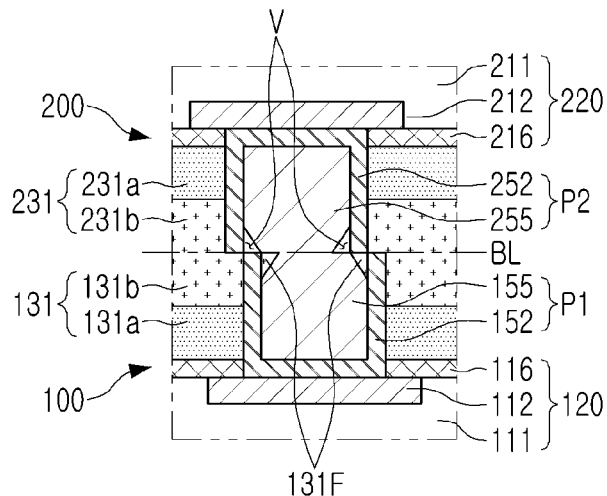
FIGS. 12A through 12C are cross-sectional views illustrating semiconductor devices according to various embodiments.
Figure 12B:
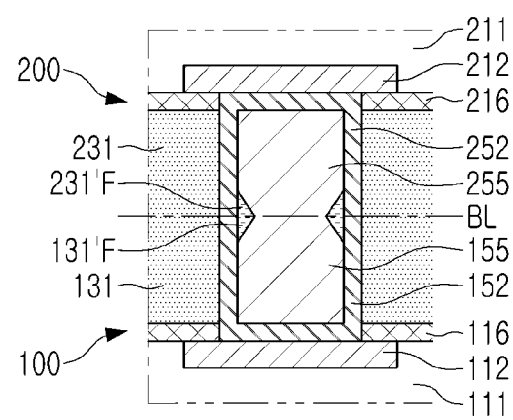
Figure 12C:
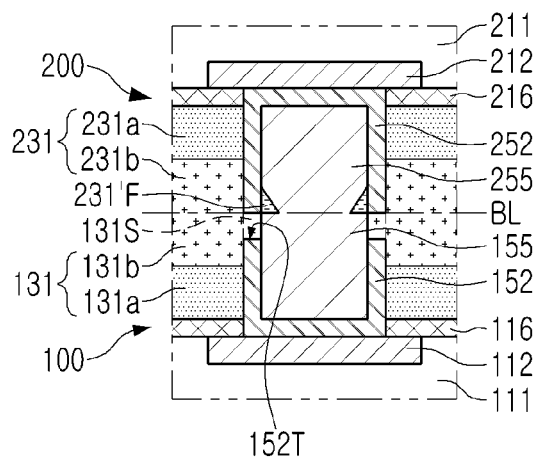

FIGS. 12A through 12C are cross-sectional views illustrating semiconductor devices in accordance with various embodiments.

Referring to FIG. 12A, a semiconductor device may be similar to the embodiment shown in FIG. 10, except that the second semiconductor chip 200 may be misaligned with the first semiconductor chip 100 while the void V is present in the bonding structure of the second semiconductor chip 200. In addition, the elements of the embodiment of FIG. 12A may be understood with reference to the descriptions of the same or similar elements of the embodiment shown in FIG. 10 unless specifically stated otherwise.

The first semiconductor chip 100 employed in this embodiment has a void-free structure as described in the embodiment of FIG. 10. Specifically, an end portion of the first barrier 152 extends to the bonding interface BL, and the portion 131F in contact with (or filling) a side region of the first metal pad 155 adjacent to the bonding interface BL may be separated from other portions of the first insulating layer 131 by the first barrier 152.

Similarly, the second semiconductor chip 200 has voids V around the second metal pad 255. Specifically, the end portion 252T' of the second barrier 252 extends to the bonding interface BL, and the voids V are generated between the second barrier 252 and a side region of the second metal pad 255 at the region adjacent to the bonding interface BL.

In addition, in the embodiment of FIG. 12A, the first and second metal pads 155 and 255 may be bonded to be slightly staggered in the tolerance range.

Also in the embodiment of FIG. 12A, even if the voids V are present on the bonding surface of the second semiconductor chip 200 and slightly misaligned, the voids are removed from the bonding surface of the first semiconductor chip 100 on the other side, thereby improving the overall bonding strength.

Referring to FIG. 12B, a semiconductor device may be similar to the embodiment shown in FIG. 10 except that the first and second insulating layers 131 are formed of a single insulating material, and the filling portions 131F' and 231F' contacting the side region are formed of a material different from the first and the second insulating layers 131 and 231.

In addition, the elements of the embodiment of FIG. 12B may be understood with reference to the descriptions of the same or similar elements of the embodiment shown in FIG. 10 unless specifically stated otherwise.

Unlike the embodiment of FIG. 10, the first and second insulating layers 131 and 231 may be formed of a single material. For example, the first and second insulating layers 131 and 231 may include silicon oxide, silicon nitride, silicon oxynitride, silicon carbonitride, and the like.

End portions of the first and second barriers 152 and 252 extend to the bonding interface BL, respectively, and the filling portions 131F' and 231F' contacting side regions of the first and second metal pads 155 and 255 adjacent to the bonding interface BL may be separated from the first and second insulating layers 131 and 231 by the first and second barriers 152 and 252, respectively. The filling portions 131F' and 231F' may be materials different from those of the first and second insulating layers 131 and 231, respectively.

Specifically, in the forming process (see FIG. 11B) of the additional insulating layer of the above-described manufacturing processes, the additional insulating layer 131c may be obtained in a form according to the embodiment of FIG. 12B by using a material different from that of the first insulating layer 131.

Referring to FIG. 12C, a semiconductor device may be similar to the exemplary embodiment illustrated in FIG. 10 except that the first semiconductor chip 100 may employ another type of void-free structure. In addition, the elements of the embodiment of FIG. 12C may be understood with reference to the descriptions of the same or similar elements of the embodiment shown in FIG. 10 unless specifically stated otherwise.

The first semiconductor chip 100 has a void-free structure described with reference to FIG. 3 in a form different from that of the second semiconductor chip 200. In detail, the end portion 152T of the first barrier 152 may be spaced apart from the bonding interface BL, and at the space region, the first insulating layer 131 may a portion 131S in contact with a side region of the first metal pad 155 and adjacent to the bonding interface BL.

On the other hand, the second semiconductor chip 200 has a void-free structure as described in the embodiment of FIG. 10. Specifically, an end portion of the second barrier 252 extends to the bonding interface BL and the portion 231F' in contact with the side region of the second metal pad 255 and adjacent to the bonding interface BL may be separated from the second insulating layer 231 by the second barrier 252.

As a result, no void exists around the first and second metal pads 155 and 255 adjacent to the bonding interface BL, and thus the bonding strength may be enhanced.

By removing the voids generated during the chemical mechanical polishing process through a subsequent process, it is possible to improve the reliability of the bonding strength between the first and second semiconductor chips.

Various and advantageous advantages and effects of the present disclosure are not limited to the above description. Rather additional advantageous advantages and effects will be more readily understood in the process of describing the specific embodiments of the present disclosure. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application. Features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, the method comprising:
    forming a first substrate, the first substrate including a first dielectric layer and a first metal pad in the first dielectric layer;
    forming a second substrate, the second substrate including a second dielectric layer and a second metal pad in the second dielectric layer; and
    bonding the first substrate to the second substrate, wherein the first dielectric layer is bonded to the second dielectric layer, and the first metal pad is bonded to the second metal pad,
    wherein at least one of the first substrate and the second substrate is formed by steps of:
        forming a first insulating layer on a device substrate;
        forming an opening in the first insulating layer;
        forming a barrier on an inner surface of the opening;
        forming a metal pad material on the barrier to fill the opening;
        polishing the metal pad material to expose a portion of the barrier in the opening, wherein a gap is formed between the exposed portion of the barrier and the polished metal pad material;
        expanding the gap by removing the exposed portion of the barrier;
        forming a second insulating layer on the first insulating layer to fill the opening and the expanded gap; and
        polishing the first insulating layer and the second insulating layer such that the metal pad material has a top surface substantially planar with an upper surface of the polished first insulating layer.

2. The method of claim 1, wherein, after the polishing the metal pad material, an upper end of the barrier is lower than an upper end of the polished metal pad material.

3. The method of claim 1, wherein an edge portion of an upper end of the metal pad material is removed during the polishing the metal pad material.

4. The method of claim 1, wherein the expanding the gap is performed by wet etching process.

5. The method of claim 1, wherein, after the polishing the first insulating layer and the second insulating layer, an upper end of the barrier is covered with the polished second insulating layer.

6. The method of claim 5, wherein the top surface of the metal pad material is substantially planar with a polished surface of the polished second insulating layer.

7. The method of claim 1, wherein, after the polishing the first insulating layer and the second insulating layer, an upper end of the metal pad material is surrounded by the polished second insulating layer.

8. The method of claim 1, wherein the second insulating layer includes a same material as that of the first insulating layer.

9. The method of claim 1, wherein the second insulating layer includes a material different from that of the first insulating layer.

10. The method of claim 1, wherein an upper end of the barrier is spaced apart from a bonding interface between the first substrate and the second substrate.

11. The method of claim 10, wherein the upper end of the barrier is spaced apart from the bonding interface by a distance of about 1 nm to about 100 nm.

12. The method of claim 1, wherein the first insulating layer includes a first insulating film disposed on the first substrate and a second insulating film disposed on the first insulating film.

13. The method of claim 12, wherein the first insulating film includes silicon oxide, and the second insulating film includes an insulating material including silicon oxynitride, silicon carbonitride, or silicon nitride.

14. The method of claim 1, wherein a width of the second metal pad is greater than a width of the first metal pad, and a portion of the first insulating layer around the first metal pad is in contact with a top surface of the second metal pad.

15. A method of manufacturing a semiconductor device, the method comprising:
forming a first substrate, the first substrate including a first dielectric layer and a first metal pad in the first dielectric layer;
forming a second substrate, the second substrate including a second dielectric layer and a second metal pad in the second dielectric layer; and
bonding the first substrate to the second substrate, wherein the first dielectric layer is bonded to the second dielectric layer, and the first metal pad is bonded to the second metal pad,
wherein at least one of the first substrate and the second substrate is formed by steps of:
forming a first insulating layer on a device substrate;
forming an opening in the first insulating layer;
forming a barrier on an inner surface of the opening;
forming a metal pad material on the barrier to fill the opening;
polishing the metal pad material to expose a portion of the barrier in the opening, wherein a gap is formed between the exposed portion of the barrier and the polished metal pad material;
forming a second insulating layer on the first insulating layer to fill the opening and the gap; and
polishing the first insulating layer and the second insulating layer such that the metal pad material has a top surface substantially planar with the polished first insulating layer.

16. The method of claim 15, wherein, after the polishing the first insulating layer and the second insulating layer, a remaining portion of the second insulating layer is disposed between the barrier and the metal pad material to fill the gap.

17. The method of claim 16, wherein, after the polishing the first insulating layer and the second insulating layer, an upper end of the metal pad material is surrounded by the remaining portion of the second insulating layer, and the remaining portion of the second insulating layer is surrounded by the barrier.

18. The method of claim 15, wherein the second insulating layer includes a same material as that of the first insulating layer.

19. The method of claim 16, wherein the second insulating layer includes a material different from that of the first insulating layer.

20. A method of manufacturing a semiconductor device, the method comprising:
forming an opening in a first insulating layer disposed on a substrate;
forming a barrier on an inner surface of the opening and an upper surface of first insulating layer;
forming a metal pad material on the barrier to fill the opening;
chemically mechanically polishing the metal pad material to expose a portion of the barrier, wherein a gap is formed between the exposed portion of the barrier and the polished metal pad material;
expanding the gap by removing the exposed portion of the barrier;
forming a second insulating layer on the metal pad material to fill the opening and the gap; and
polishing the first insulating layer and the second insulating layer such that the metal pad material has a top surface substantially planar with upper surfaces of the first insulating layer and the second insulating layer.

* * * * *